United States Patent

Wing et al.

[15] 3,685,117

[45] Aug. 22, 1972

[54] ALIGNMENT FIXTURE

[72] Inventors: Henry Wing; Ray Cooper, both of Philadelphia, Pa.

[73] Assignee: Jade Corporation, Beth Ayres, Pa.

[22] Filed: May 12, 1970

[21] Appl. No.: 36,542

[52] U.S. Cl. ..................29/203 P, 33/184.5, 96/36.2, 269/21, 269/289, 355/78, 355/85, 355/103

[51] Int. Cl. ..............................................G03b 27/02

[58] Field of Search .........255/78, 85, 103; 29/203 P; 269/21, 289, 304; 96/36.2; 33/184.5

[56] References Cited

UNITED STATES PATENTS

| | | | |
|---|---|---|---|
| 3,192,844 | 7/1965 | Szasz | 355/78 |
| 3,220,331 | 11/1965 | Evans | 355/78 |
| 1,413,406 | 4/1922 | Huebner | 355/78 |

*Primary Examiner*—Samuel S. Matthews
*Assistant Examiner*—Monroe H. Hayes
*Attorney*—Seidel, Gonda & Goldhammer

[57] ABSTRACT

An alignment fixture comprising a wafer carrying member which is moveable relative to a base and which is interconnected thereto by means of three pivotably mounted levers which are moved about their pivots by micrometers.

11 Claims, 5 Drawing Figures

INVENTORS
HENRY WING
RAY COOPER
BY
Seidel, Gonda & Goldhammer
ATTORNEYS

INVENTORS
HENRY WING
RAY COOPER
BY
Seidel, Gonda & Goldhammer
ATTORNEYS.

INVENTORS
HENRY WING
RAY COOPER
BY
Seidel, Gonda & Goldhammer
ATTORNEYS.

ALIGNMENT FIXTURE

This invention relates to an alignment device and more particularly to an alignment device which can be used to align a wafer on which microcircuits are to be fabricated with a mask containing the desired circuit geometry.

In the fabrication of microcircuits on small chips or wafers, it has been the practice to coat the surface of a wafer on which the microcircuits are to be formed with a photosensitive coating. Then a mask having the desired circuit geometry thereon is brought into alignment with the wafer and is exposed to light. The light is, of course, obstructed by most of the mask. However, on that portion of the mask on which the geometry of the microcircuits are drawn, light is permitted to pass through to contact the photosensitive surface of the wafer. The wafer is "developed" to remove the exposed photosensitive coating and to thereby leave microcircuits of identical configuration as those on the mask.

Ordinarily the wafers contain a plurality of geometries that are each only a few ten-thousandths of an inch in size and thus it becomes extremely difficult to accurately align them with related geometries in the mask. Alignment can be achieved by providing at least two spots or points on the wafer which, by means of a microscope, are aligned with two corresponding spots or points on the mask. Because of the small size of the geometries of each circuit it is difficult to position the wafers without the use of micromanipulators. Additionally, it is necessary for alignment purposes to be able to translate the wafer relative to the mask in two substantially perpendicular paths that lie in a plane substantially parallel to the mask and at the same time be able to rotate the wafer relative to the mask about an axis which is perpendicular to the plane described by the aforementioned paths.

It is important that the parts comprising the alignment device be of close tolerance since air spaces between moving parts can result in air film pressures which will cause the parts to move into disalignment after the wafer and mask have been aligned.

Accordingly, it is an object of this invention to provide a novel mask alignment fixture for a wafer on which microcircuits are to be formed.

It is a further object of this invention to provide a mask alignment fixture having a wafer carrying means which is supported on a base and which is movable relative thereto by means of structure which overcomes deficiencies of the prior art.

It is a still further object of this invention to provide a mask alignment fixture having a wafer carrying means which is supported on a base for relative movement therewith by means of structure which is simple, reliable and inexpensive.

It is a further object of this invention to provide a mask alignment fixture which substantially eliminates air films between moving parts thereof.

It is another object of this invention to provide an alignment fixture having a wafer carrying means which is supported on a base and having lever means which are mounted on the base and interconnected to the wafer carrying means by a plurality of wires.

It is a further object of this invention to provide an alignment fixture having a wafer carrying means which is supported on a base and having lever means which are mounted on the base and interconnected to the wafer carrying means by a plurality of pin and slot connections.

Generally, the invention relates to an alignment fixture for aligning a wafer on which microcircuits are to be formed with a mask containing the outline of the microcircuits. The alignment fixture comprises a base that supports the wafer carrying means for relative movement therebetween. Means are mounted on the base which are in engagement with the wafer carrying means for moving the wafer carrying means relative to the mask so that alignment indicia on the mask and the wafer can be brought into coincidence. The moving means comprises first lever means which is pivotally mounted to the base and which has one end coupled to the wafer carrying means. Extensible means are mounted on the base and are in engagement with the second end of the first lever means so that extension thereof against the second end of the lever means causes translation of the wafer carrying member in a first direction. Biasing means are mounted on the base for urging the second end into engagement with the extensible member. The moving means further comprises second means mounted on the base and being coupled to the wafer carrying member. Additional extensible means are mounted on the base and are in engagement with the second means so that extension thereof causes translation of the wafer carrying member in a second direction that is substantially perpendicular to the first direction. Biasing means are mounted on the base for urging the second means into engagement with the second extensible member.

Other objects and advantages of the subject invention will become apparent from a detailed description of the invention which follows wherein.

Figure 1:
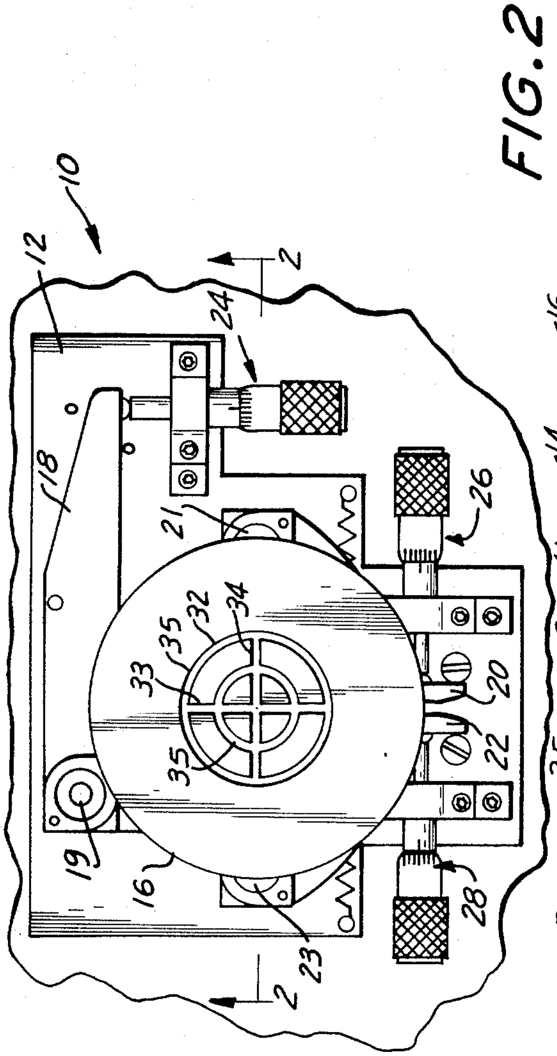
FIG. 1 is a plan view of the alignment fixture which supports a wafer on which microcircuits are to be formed.

The invention can b e described by referring to FIG. 1 wherein a preferred form of the alignment fixture 10 is illustrated. The alignment fixture comprises a substantially rectangular base 12 which supports a block 14 (FIG. 2) which in turn supports a cover 16. The block 14 and cover 16 cooperate to define a wafer carrying means as will be more completely described herein. The block and base are interconnected to each other by a plurality of levers 18, 20, and 22 which are pivotally supported on the base by pins 19, 21, and 23. The levers have one end in engagement with the block 14 as will be described with more particularity herein while they have their other ends in engagement with micrometers 24, 26 and 28.

Adjustment of the micrometers causes the levers to move around their pivots and thereby cause a corresponding movement in block 14 and cover 16, thus moving the wafer relative to a mask on which the microcircuit geometries appear.

Figure 2:
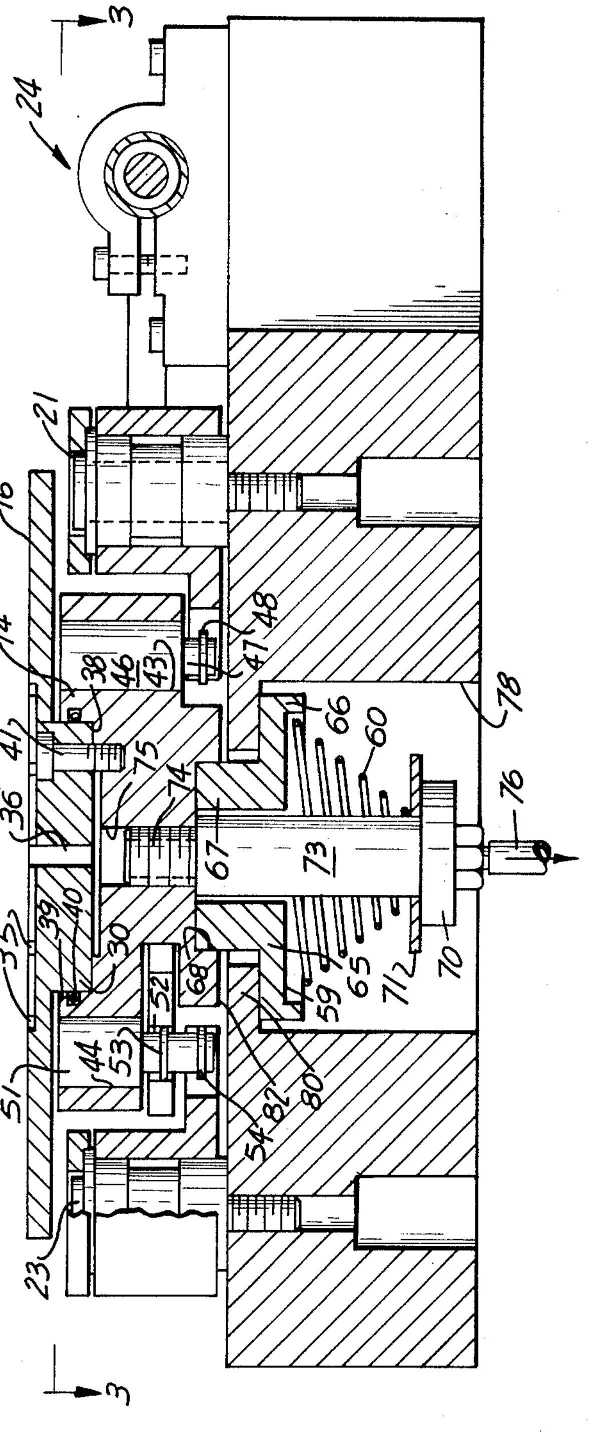
FIG. 2 is a sectional view taken along line 2—2 of FIG. 1 at a substantially increased scale.

Referring now to FIG. 2 for a detailed description of the base, block and cover, it can be seen that the cover has a substantially flat upper surface with a centrally positioned boss 30 depending from its lower surface. A grid 32 comprised of a plurality of grooves including cross grooves 33 and 34 and concentric ring grooves 35 are connected by an elongated cylindrical aperture 36 to a source of vacuum. After a wafer on which microcircuits are to be formed is placed on the grid, the vacuum is employed to hold it in position.

Block 14 has a centrally positioned recess 38 therein defined by a side wall 39 which receives the aforementioned depending boss 30. Recess 40 in side wall 39 carries an O-ring to constrain boss 30 against slipping. A plurality of spaced circumferentially disposed bolts 41 are employed to connect the cover to the base. Preferably only three of such bolts equally spaced are utilized.

Block 14 includes two diametrically opposed elongated cylindrical openings 43 and 44 which house bearing pins which are in turn connected to the aforementioned levers. Cylindrical opening 43 supports a cylindrical bearing pin 46 which has a cylindrical depending extension 47 of reduced diameter that supports a radially extending bearing flange 48. A bearing pin 51 is supported in cylindrical opening 44. This bearing pin includes an elongated depending extension 52 having a reduced diameter which supports axially spaced radially extending bearing flanges 53 and 54.

A spring seat 59 which supports a slightly compressed conical spring 60 comprises an outwardly directed flange 65 which supports a downwardly directed circumferential lip 66 which restrains the spring against radial movement. An upwardly directed cylindrical member 67 which is connected to flange 65 is received in a recess 68 in a bottom of block 14. A bolt 70 supports a washer 71 against its head which in turn bears against the opposite end of the aforementioned conical spring. The bolt has a hollow shank 73 and a hollow thread end 74 which is of reduced diameter. The bolt is threadingly received in an opening 75 in the stage block. The opening in the bolt may be connected to a suitable hose 76 which is connected to a source of vacuum or air pressure. In this regard, it should be observed that the conduit running through the bolt is in communication with the aforementioned opening 36 and grid 32. While not necessary, it is to be preferred, for the compactness of the alignment fixture, that the bolt 70 and conical spring 60 be contained in a recess 78 in the base. Such a recess may be provided with an inwardly directed flange 80 that is engaged by the aforementioned flange 65 on the spring seat. Thus, it can be seen that the spring is normally operative to draw cover 16 and block 14 into engagement with spring seat 59. However, the force of the spring can be overcome by forcing air under pressure through the aforementioned hose 76. This feature permits limited vertical movement between the wafer carrying means and the base so that, if desired, the mask can actually physically engage the wafer. Additionally space 82 between block 14 and space 12 permits slight downward, resilient movement of the block against the force of spring 60.

Figure 3:
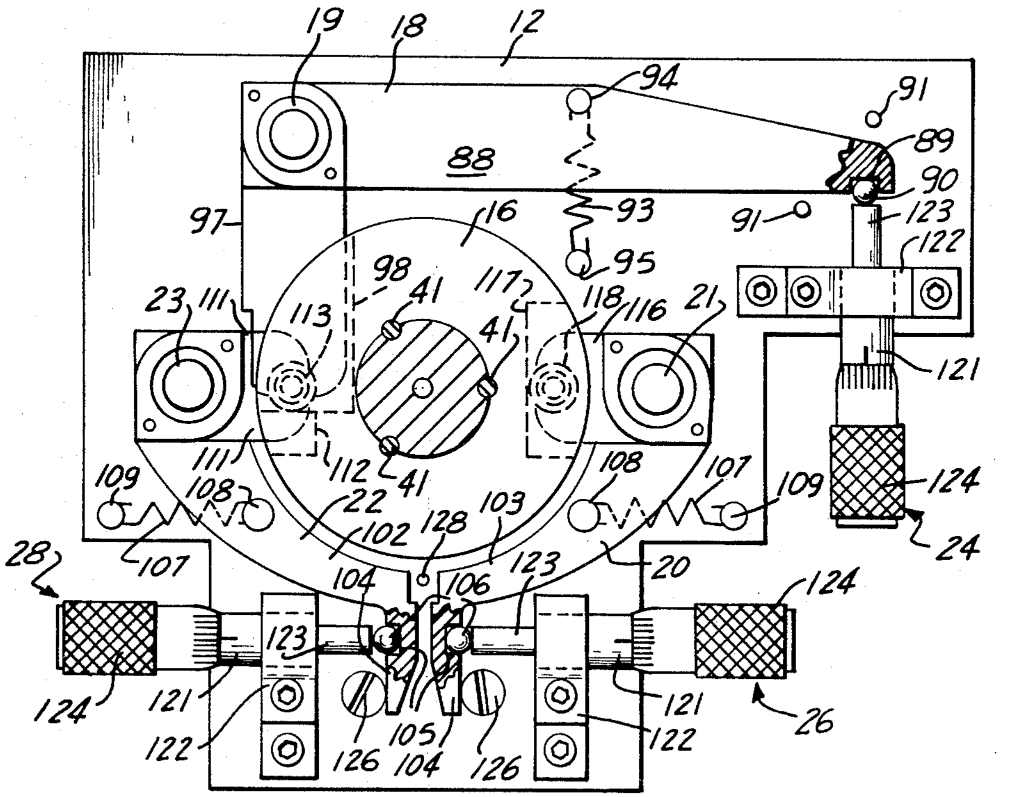
FIG. 3 is a sectional view taken along line 3—3 of FIG. 2 and showing a first embodiment of the device.

Referring now to FIG. 3 wherein one preferred form of the mode of connection between the levers and the wafer carrying means is disclosed it is seen that lever 18 comprises an elongated arm 88 which includes a recess 89 in which is housed a stainless steel ball 90. Additionally stops 91 which may be pins or the like are provided on either side of elongated arm 88 to limit its movement about pin 19.

A helical spring 93 has one end connected to a pin on the arm 88 and has its second end connected to a pin on base 12. Preferably pins 94 and 95 have grooves therein in which the ends of the spring can be received. The spring is under tension and thus tends to urge arm 88 in a generally clockwise direction about pin 19.

Figure 4:
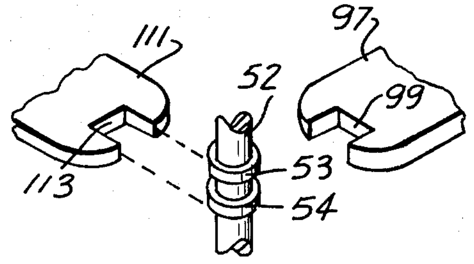
FIG. 4 is an exploded view of a pin and slot connection which comprises one of the connections of the embodiment shown in FIG. 3.

Lever 18 also includes a relatively short arm 97 that fits into a recess 98 in plate 14. The short arm has a generally square notch 99 at its end which is engageable with the aforementioned bearing flange 53 on bearing pin extension 52 (FIG. 4). It is preferred that arm 88 be approximately five times as long as arm 97 in order to provide a sufficient ratio to permit incremental movement of notch 99 along the arc which has pin 19 at its center. Actually, ratios less than 5 to 1 or greater than 5 to 1 can be employed and it is the intent to include all such ratios within the scope of this invention provided that they permit the incremental movement of notch 99 as aforementioned.

Levers 20 and 22 are mirror images of each other in that they include elongated curved arms 102 and 103 that generally follow the curvature of the cover 16 and which include radially extending dog legs 104. Each of the dog legs includes a recess 105 which receives a stainless steel ball 106. Helical springs 107 which are under tension are interconnected between arms 102 and 103 and base 12 by pins 108 on the arms and pins 109 on the base. It is to be noted that arm 102 is urged in a generally clockwise direction about pin 23 while arm 103 is urged in a generally counterclockwise direction about pivot pin 21. In any event the dog legs 104 tend to be urged apart by the helical springs 107.

Lever 22 includes a relatively short arm 111 that fits into a recess 112 on the underside of plate 14. The short arm 111 has a square notch 113 in its end that is adapted to engage the aforementioned bearing flange 54 which is on extension 52 depending from bearing pin 51 (FIG. 4). On lever 20 a relatively short arm 116 fits into a recess 117 on the underside of plate 14 and has a generally square notch in its end that engages flange 48 on depending extension 47 of bearing pin 46 (FIG. 2). Again, with regard to levers 20 and 22 it is to be preferred that the long arms be approximately five times the length of the short arms so that the notches at their ends can be moved in incremental amounts.

Elongated arms 88, 102 and 103 on each of the levers are driven by the aforementioned micrometers 24, 26 and 28 (FIG. 1). The micrometers comprise heads 121 that are supported by generally U-shaped clamps 122 on base 12 and comprise extensible portions 123 which are adapted to bear against the aforementioned stainless steel balls 90 and 106 so that the levers can be driven around their pivots against the force of their respective springs. Each micrometer has a rotatable handle 124 which carries indicia indicating the extent to which aforementioned portions 123 have been extended.

In order to limit the movement of arms 102 and 103 between carefully defined limits, shoulder screws 126 are mounted in base 12 and are adapted to engage the dog legs 104 when the extensible portions 123 of the micrometers are backed off a sufficient extent. Stop 128 which may be in the form of a suitable pin is disposed intermediate the two dog legs so that neither of them can be driven by its respective micrometer past that point.

Stops 91, 123 and 128 function advantageously to limit the movement of the respective levers within carefully defined limits since excessive movement could damage the delicate relationship between the various parts and also might cause damage to the micrometers since their ratio of turns per unit of advancement may be extremely high. Ordinarily micrometers are provided with 40 threads per inch thereby resulting in one full turn of the dial moving the extensible portion 123 by twenty-five-thousandths of an inch with a corresponding movement of the short end of each arm of five-thousandths of an inch. Since, however, micrometers are graduated in increments of one-thousandth of an inch the device is capable of moving any one of the shorter arms of any of the levers through an increment equivalent to 0.0002 inch. By interpolating the micrometer readings increments as small as microinches can be accomplished readily by observation of the movement through a microscope.

Utilization of this embodiment of the invention is by placing the wafer on which the microcircuits are to be formed on the cover 16. A vacuum is then applied through hose 76 to hold it in place. By visual observation through a microscope, indicia on the wafer are aligned with indicia on the mask. Preferably, such indicia can take the form of two spaced points. For maximum accuracy in aligning the mask and wafer, the points should be spaced as far apart as possible. A convenient spacing for the points has been found to be equivalent to the distance between bearing pins 46 and 51. In order to bring the points into alignment with each other the operator may first align the machine so that notches 113 and 118 in levers 20 and 22 are directly opposite each other thereby confining pins 46 and 51 for transverse translational movement as illustrated in FIG. 3. Then actuation of micrometer 24 will cause cover 16 to move transversely in the notches 113, 118 until one of the alignment points on the wafer is disposed along a vertical (FIG. 3) line of movement which will pass through one of the alignment points on the mask.

Then simultaneous movement of micrometers 26 and 28 to drive levers 20 and 22 oppositely of each other will result in the wafer carrying means being moved along that vertical line on FIG. 3 until the first point on the mask and wafer are aligned. Then, by merely rotating micrometer 26, plate 16 is rotated about pin 51 to bring the other alignment point on the mask and wafer into alignment with each other.

Figure 5:
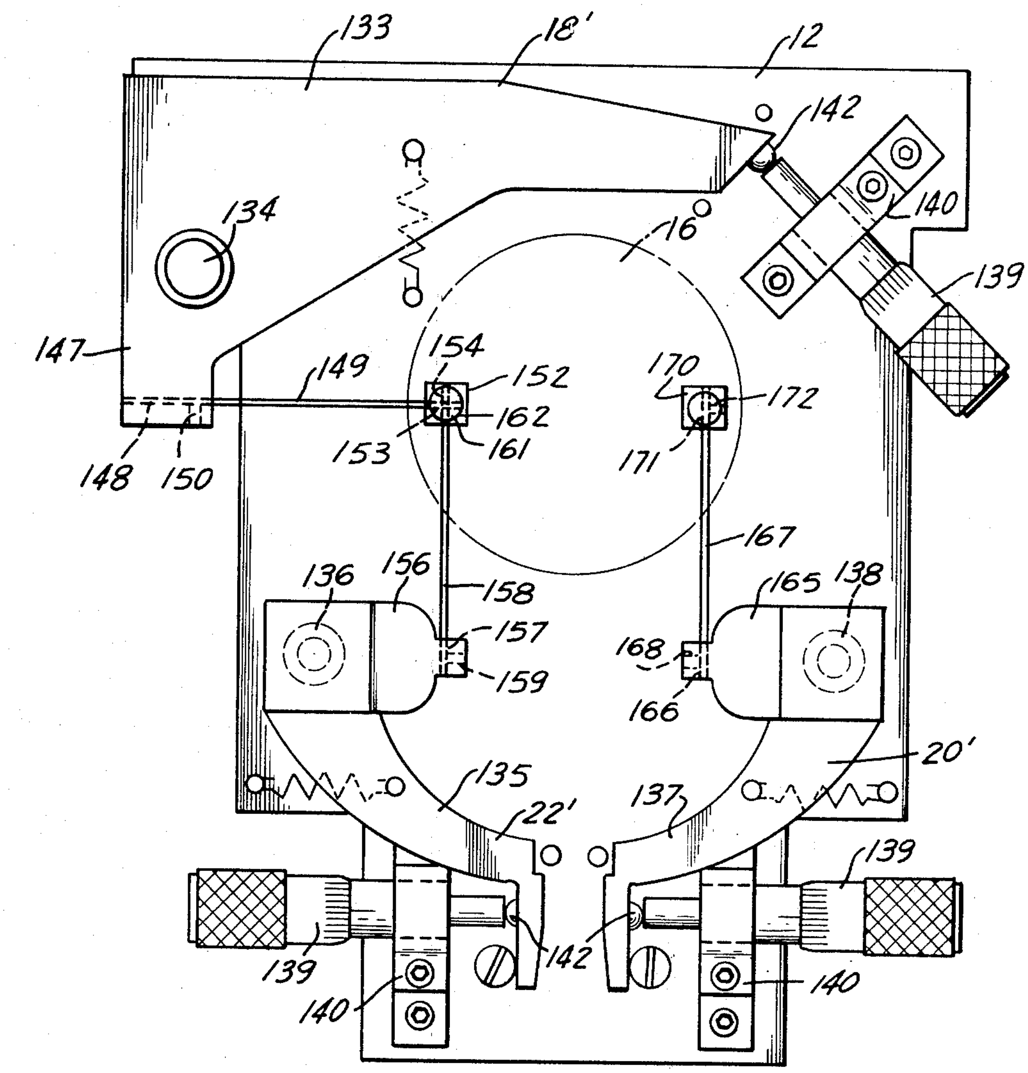
FIG. 5 is a view similar to that of FIG. 3, however showing a different but equally important embodiment of the invention.

Referring now to FIG. 5 wherein a second preferred form of the invention is illustrated, it can be seen that the base 12 has been modified to the extent that it has been enlarged to accommodate levers 18', 20', and 22'. These levers are substantially identical to the above-described levers 18, 20 and 22 in that they include elongated arms 133, 135 and 137 and that they are provided with relatively long arms, 133, 135 and 137 and relatively short arms 147, 156 and 165. Additionally, each of these levers is driven about its respective pivot pin by means of a micrometer 139 which is secured to base 12 by a suitable clamp 40 and which has an extensible member that bears against a steel ball 142 at the end of the elongated arms. It should be noted that in distinction to the above-described embodiment the various pivot pins are placed further from the wafer carrying means than the embodiment illustrated in FIG. 3. This necessitates that the base be slightly widened and elongated in order to provide suitable anchoring positions for the pins.

Additionally, each of the levers is provided with a helical spring under tension which tends to urge each of the elongated arms into engagement with its respective micrometer.

The shorter arms on each of the levers is connected to the block 14 by a suitable wire. It is preferred that the wire be of sufficient thickness and modulus so that it will not have any tendency to elongate or compress. It has been found that if the design requirements of the device are such that the wire should be 2 inches in length then a suitable diameter than provides sufficient modulus and thickness is approximately 0.031 inches in diameter. Naturally for wires of increased length the diameter will have to be increased while for wires of reduced length the diameter may be decreased.

Leg 147 on lever 18' has an elongated cylindrical opening 148 which receives a wire 149. The wire may be anchored in the opening by a suitable set screw 150. A block 152 in block 14 which corresponds to bearing pin 51 in the first embodiment has an elongated opening 153 therein which receives the opposite end of wire 149. A second set screw 154 is utilized to anchor this end of the wire in the block 152. Lever 22' has an elongated wire 158 anchored in an opening 157 in the end of arm 156. A set screw 159 is utilized to hold this end of the wire in place. The opposite end of the wire is mounted in an opening 161 in block 152 and is held therein by a set screw 162. On lever 20', its relatively short end 165 has an opening 166 therein which receives one end of wire 167. That end of the wire is anchored in position by a set screw 168. The opposite end of the wire is anchored to block 14 by means of a block 170 which is similar to the aforedescribed block 152 on the opposite side of block 14 and which corresponds in function to bearing pin 46 in the first embodiment. Block 170 has an opening 171 therein which is adapted to receive the opposite end of wire 167 and has an aperture for a set screw 172 which is utilized to hold the wire in place.

This embodiment of the alignment device functions in a substantially similar fashion to the embodiment described and disclosed in FIG. 3. A principal distinction being that in this embodiment the levers are coupled to the wafer carrying means by a plurality of wires while in the other embodiment the levers are coupled to the wafer carrying means by a plurality of pin and slot connections. It should be noted that in both cases the levers are capable of moving the wafer carrying means within microinches and thus air films between various parts are eliminated and accurate alignment of the mask and wafers can be achieved.

While this invention has been described with reference to two specific embodiments, it is to be understood that many other embodiments of this invention will be obvious to a person of ordinary skill in the art in light of this disclosure. Accordingly, the scope of the invention should not be limited by the foregoing description but rather only by the scope of the appended claims.

We claim:

1. An alignment device for aligning a wafer on which microcircuits are to be formed with a mask containing the outline of the microcircuits comprising a base; said base supporting wafer carrying means for relative movement therebetween; means mounted on said base and in engagement with said wafer carrying means for moving said wafer carrying means relative to the mask so that alignment indicia on the mask and the wafer can be brought into coincidence; said moving means comprising first lever means pivotally mounted to said base and having one end coupled to said wafer carrying means; first extensible means mounted on said base and in engagement with a second end of said first lever means so that extension thereof against said second end causes translation of said wafer carrying means in a first direction, biasing means mounted on said base for urging said second end into engagement with said extensible means; said moving means further comprising second and third means mounted on said base and being coupled to said wafer carrying means, second and third extensible means mounted on said base in engagement with each of said second and third means so that extension thereof causes translation of said wafer carrying means in a second direction that is substantially perpendicular to said first direction, and biasing means mounted on said base for urging said second and third means into engagement with said second and third extensible means.

2. An alignment device as defined in claim 1 wherein said second and third means comprises second and third lever means, each being pivoted to said base and being in mutually facing relation to each other, each of said second and third lever means having one end coupled to said wafer carrying means in diametrically opposed positions, said second and third extensible means mounted on said base for respectively engaging the other ends of said second and third lever means, and said first lever means and said second lever means are coupled to said wafer carrying means at a common point so that rotation of said third lever means about its pivot causes said wafer carrying means to rotate about said common point.

3. An alignment device as defined in claim 2 wherein said lever means are coupled to said wafer carrying means by relatively slender, elongated resilient members that are fixed to said wafer carrying means and said ends of each lever means.

4. An alignment device as defined in claim 3 wherein said resilient members are comprised of wire.

5. An alignment device as defined in claim 4 wherein said ends of said first, second and third lever means that are coupled to said wires are angularly disposed with respect to said other ends so that all of said lever means substantially surround said wafer carrying means to provide a compact device.

6. An alignment device as defined in claim 2 wherein each of said lever means is coupled to said wafer carrying means by pin and slot connections so that movement of each of said lever means about their pivots causes said pins to move in said slots and said wafer carrying means to move relative to said base.

7. An alignment device as defined in claim 2 wherein said common point comprises first pin means on said wafer carrying means, and said first and second lever means have slots engaging said first pin means.

8. An alignment device as defined in claim 7 wherein said other point comprises second pin means depending from said wafer carrying means, said third lever means includes a slot engaging said second pin means.

9. An alignment device as defined in claim 8 wherein said first and second pin means include bearing flanges, said first pin includes at least two axially spaced flanges for respective engagement with said first and second lever means and said second pin includes at least one flange for engagement with said third lever means.

10. An alignment device as defined in claim 9 wherein said ends of said first, second and third lever means that include said slots are angularly disposed with respect to said other ends so that all of said lever means substantially surround said wafer carrying means to provide a compact device.

11. An alignment device for aligning a wafer on which microcircuits are to be formed with a mask containing the outline of the microcircuits comprising a base; said base supporting wafer carrying means for relative movement therebetween; said wafer carrying means having two diametrically opposed coupling points; means mounted on said base and in engagement with said wafer carrying means for moving said wafer carrying means relative to the mask so that alignment indicia on the mask and the wafer can be brought into coincidence; said moving means comprising first, second and third levers pivotally mounted to said base, said first and second levers each having one end connected to one of said coupling points and said third lever having one end connected to said other coupling point, extensible micrometers mounted on said base and in engagement with the second ends of said levers so that extension thereof against said second ends causes movement of said wafer carrying means, means connected to each of said second ends for urging it into engagement with its respective extensible micrometer; said second and third levers being mounted on said base in mutually facing relation to each other and having their first ends coupled to said wafer carrying means in diametrically opposed positions; and said ends of said first, second and third levers that are coupled to said wafer carrying means are angularly disposed with respect to said other ends so that all of said lever substantially surround said wafer carrying means to provide a compact device.

* * * * *